(12) United States Patent
Mitsui et al.

(10) Patent No.: US 8,773,131 B2
(45) Date of Patent: Jul. 8, 2014

(54) MAGNETIC RESONANCE IMAGING APPARATUS AND RF COIL

(75) Inventors: Shinji Mitsui, Tochigi (JP); Hiroki Motohashi, Tochigi (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 387 days.

(21) Appl. No.: 12/762,243

(22) Filed: Apr. 16, 2010

(65) Prior Publication Data

US 2010/0271022 A1 Oct. 28, 2010

(30) Foreign Application Priority Data

Apr. 24, 2009 (JP) ................................. 2009-106790
Mar. 9, 2010 (JP) ................................. 2010-052125

(51) Int. Cl.
*G01V 3/00* (2006.01)

(52) U.S. Cl.
USPC ......................................... 324/318; 324/322

(58) Field of Classification Search
USPC .................. 324/318, 322, 306, 300
See application file for complete search history.

(56) References Cited

U.S. PATENT DOCUMENTS

| 5,548,218 | A  | * | 8/1996  | Lu ................................. 324/318 |
| 5,951,474 | A  | * | 9/1999  | Matsunaga et al. ........... 600/422 |
| 6,624,633 | B1 | * | 9/2003  | Zou et al. ..................... 324/318 |
| 6,639,406 | B1 | * | 10/2003 | Boskamp et al. ............. 324/318 |
| 6,888,351 | B2 | * | 5/2005  | Belt et al. ..................... 324/318 |
| 6,975,115 | B1 | * | 12/2005 | Fujita et al. .................. 324/318 |
| 7,026,818 | B2 | * | 4/2006  | Machida et al. .............. 324/322 |
| 7,046,006 | B2 |   | 5/2006  | Creemers |
| 7,394,253 | B2 |   | 7/2008  | Okamoto et al. |
| 7,474,098 | B2 | * | 1/2009  | King ............................. 324/318 |
| 2004/0196042 | A1 |   | 10/2004 | Fujita et al. |

FOREIGN PATENT DOCUMENTS

| CN | 101078753 A   | 11/2007 |
| JP | H04-369850 A  | 12/1992 |
| JP | 2003-153878 A | 5/2003  |
| JP | 2005-500886 A | 1/2005  |
| JP | 2006-141444 A | 6/2006  |
| JP | 2007-021188 A | 2/2007  |
| JP | 2007-21188 A  | 2/2007  |
| JP | 2008-067733 A | 3/2008  |

OTHER PUBLICATIONS

English Summary of Chinese Office Action for corresponding CN Application No. 201010166107.5 mailed on Nov. 22, 2011.
Japanese Office Action with its English translation for Japanese Patent Application No. 2010-052125 mailed on Dec. 3, 2013.
Uli Gotshal, Daniel Nobles, "Trasmit-Receive Phased Array for MR Guided Spine Interventional Procedures", Proc. Intl. Soc. Mag. Reson. Med., Apr. 2002, vol. 10, Issue No. 327.

* cited by examiner

*Primary Examiner* — Louis Arana
(74) *Attorney, Agent, or Firm* — Yoshida & Associates, LLC

(57) ABSTRACT

A receiving RF coil includes a coil element group having a figure-eight coil, a first loop coil arranged at the center of the figure-eight coil, and a second loop coil partially overlaid on the first loop coil. Furthermore, a path switching control unit switches the transmitting paths of a signal so that the signal can be received and/or transmitted with a combination of the first loop coil and the second loop coil or a combination of the figure-eight coil and the first loop coil.

18 Claims, 13 Drawing Sheets

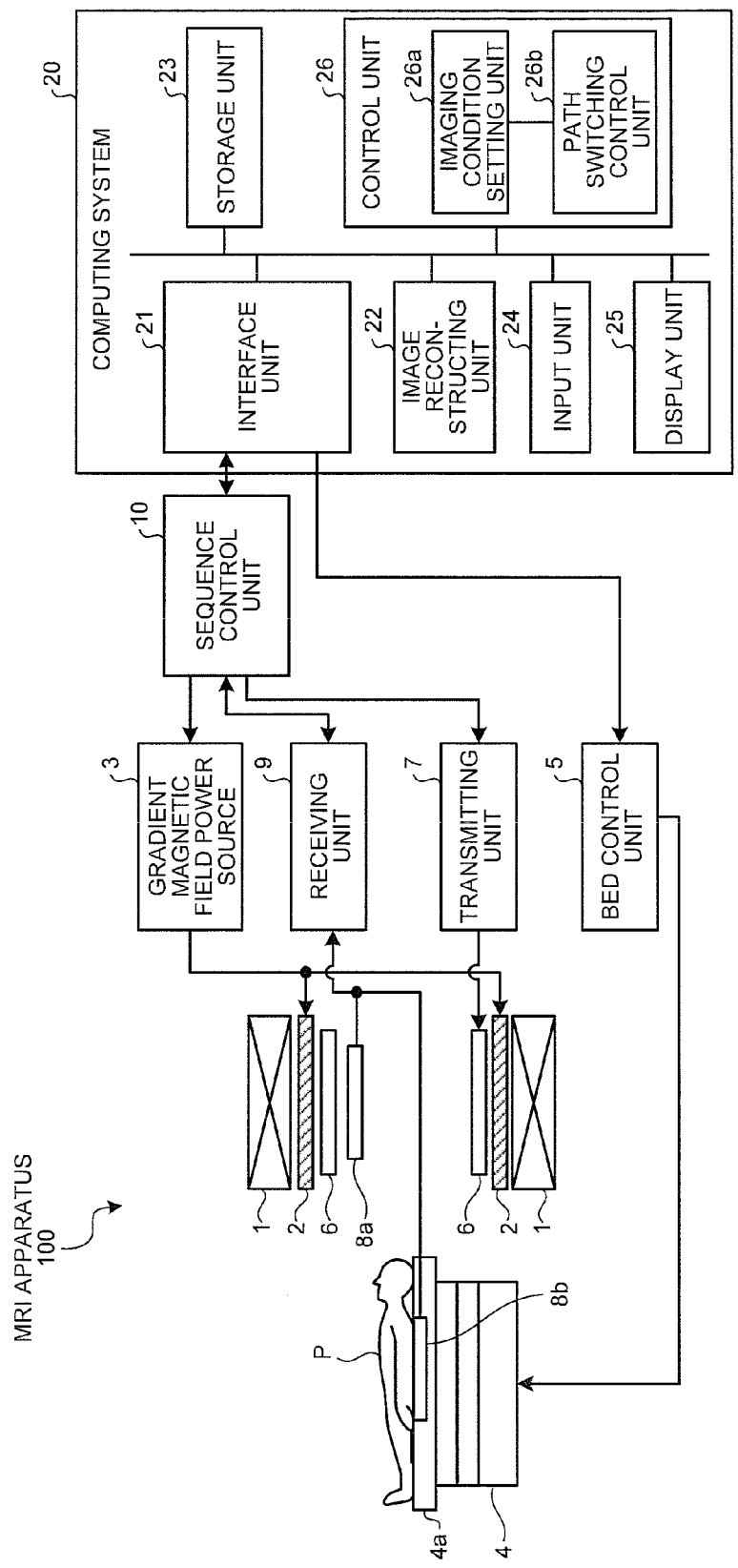

MAGNETIC RESONANCE IMAGING APPARATUS AND RF COIL

CROSS-REFERENCE TO RELATED APPLICATIONS

This application is based upon and claims the benefit of priority from the prior Japanese Patent Application No. 2009-106790, filed on Apr. 24, 2009, and Japanese Patent Application No. 2010-052125, filed on Mar. 9, 2010; the entire contents of both of which are incorporated herein by reference.

BACKGROUND OF THE INVENTION

1. Field of the Invention

The present invention relates to a magnetic resonance imaging apparatus and a radio frequency (RF) coil, and especially to decoupling of an array coil that is formed by coupling multiple coil elements.

2. Description of the Related Art

A conventional magnetic resonance imaging apparatus is a device that creates an image of the inside of the body of a subject by use of a magnetic resonance phenomenon, and the apparatus includes an RF coil to detect a nuclear magnetic resonance signal generated from the subject. An "array coil" has been widely adopted for the RF coil. An array coil is formed by coupling multiple coil elements so that the apparatus can detect signals from a wide range of area that cannot be covered by a single coil element (see JP-A No. 2007-21188 (KOKAI), for example).

More specifically, the array coil is formed of a coil element group that includes multiple coil elements. Loop coils and figure-eight coils (also referred to as saddle coils) may be used for the coil elements, and various arrangement patterns are conceivable for the coil elements. FIGS. 14A to 14D are diagrams for explaining geometrical arrangements of coil element groups in conventional array coils.

In FIG. 14A, an example arrangement incorporating three loop coils is illustrated. With this arrangement, a high sensitivity of the coil element group can be achieved deep in the depth direction and wide in the lateral direction of the subject. The signal to noise ratio (S/N) is at a standard level. In addition, an example arrangement incorporating a loop coil and a figure-eight coil is illustrated in FIG. 14B. With this arrangement, a high sensitivity of the coil element group can be achieved deep in the depth direction but narrow in the lateral direction of the subject. The S/N is high at the center of the lateral direction.

Furthermore, an example arrangement incorporating four loop coils is illustrated in FIG. 14C. With this arrangement, a high sensitivity of the coil element group can be achieved shallow in the depth direction but wide in the lateral direction of the subject. The S/N is at a standard level. In FIG. 14D, an example arrangement incorporating three loop coils and one figure-eight coil is illustrated. With this arrangement, a high sensitivity of the coil element group can be achieved deep in the depth direction and wide in the lateral direction of the subject. The S/N is at a standard level on the left and right sides of the lateral direction, and excellent at the center thereof.

When combining several coil elements as described above, the sensitivity and the S/N of the coil element group vary, depending on what types of coil elements are combined and how they are arranged. For this reason, when preparing an array coil specialized for a certain imaging area, a coil element group suitable for the area should be selected.

For example, among the coil element groups illustrated in FIGS. 14A to 14D, a coil element group that can be placed on the back of the subject to take an abdominal image and also a spinal image will be considered. First, because a high detection sensitivity is required deep in the depth direction and wide in the lateral direction of the subject when taking an abdominal image, the coil element groups illustrated in FIGS. 14A and 14C are the most suitable. On the other hand, because a high S/N is required at the center of the lateral direction of the subject when taking a spinal image, the coil element group illustrated in FIG. 14B is the most suitable.

Thus, the coil element group of FIG. 14D that has the structures of both FIGS. 14A and 14B is conceivable as the most suitable coil element group for taking an abdominal image and also a spinal image.

When the coil element group of FIG. 14D is placed on the back of the subject for taking an abdominal image and also for taking a spinal image, however, it is difficult to decouple the coil elements.

In particular, the adjacent loop coils can be easily decoupled by overlaying part of the loop coils and adjusting the area of the overlapping portion. Furthermore, the center loop coil and the figure-eight coil can be structurally decoupled because the sum of the high-frequency magnetic fields generated by the loop coil and by the figure-eight coil is zero.

It is difficult, however, to decouple the loop coils at the two ends and the figure-eight coil. Even if part of the loop coils and part of the figure-eight coil are overlaid, the lateral range in which the loop coils are allowed to be arranged is limited due to the structure of the apparatus, and therefore the area of the overlapping portion cannot be easily adjusted.

SUMMARY OF THE INVENTION

According to one aspect of the present invention, a magnetic resonance imaging apparatus includes an RF coil having a coil element group including at least a figure-eight coil, a first loop coil arranged at center of the figure-eight coil, and a second loop coil partially overlaid on the first loop coil; and a path switching unit that switches transmitting paths of a signal so that the signal is received and/or transmitted with a combination of the first loop coil and the second loop coil or a combination of the figure-eight coil and the first loop coil.

According to another aspect of the present invention, a magnetic resonance imaging apparatus includes an RF coil having at least two coil elements of different types; and a switching unit that switches transmitting paths of a signal in accordance with an imaging condition, in such a manner that the signal is received and/or transmitted with either one of or both of the two coil elements.

According to still another aspect of the present invention, an RF coil includes a coil element group that includes at least a figure-eight coil, a first loop coil arranged at center of the figure-eight coil, and a second loop coil partially overlaid on the first loop coil, wherein: transmitting paths of a signal are switched in such a manner that the signal is received and/or transmitted with a combination of the first loop coil and the second loop coil or a combination of the figure-eight coil and the first loop coil.

BRIEF DESCRIPTION OF THE DRAWINGS

FIG. 1 is a diagram for showing the entire structure of an MRI apparatus according to the first embodiment;

DETAILED DESCRIPTION OF THE PREFERRED EMBODIMENTS

Figure 2A:
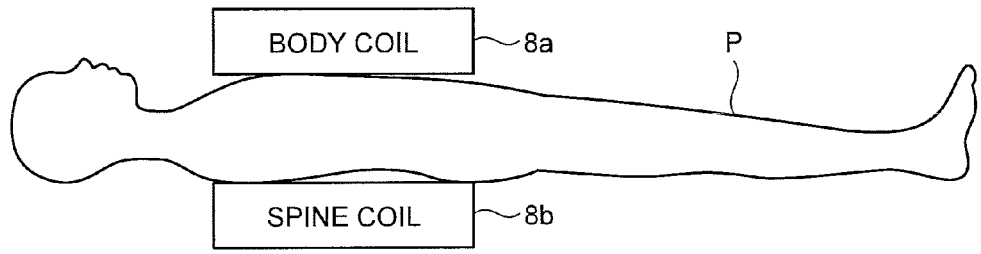
FIGS. 2A and 2B are diagrams for explaining the positional relationship of the receiving RF coil illustrated in FIG. 1.

Exemplary embodiments of the magnetic resonance imaging apparatus and the RF coil according to the present invention are explained in detail below with reference to the drawings. In the following embodiments, imaging of the abdomen and the spine is mainly described. Furthermore, the magnetic resonance imaging apparatus is referred to as an "MRI apparatus", and a nuclear magnetic resonance signal is referred to as an "NMR signal" in the following embodiments.

First, the entire structure of the MRI apparatus according to the first embodiment is explained. FIG. 1 is a diagram for showing the entire structure of an MRI apparatus 100 according to the first embodiment. The MRI apparatus 100 includes a static magnetic field magnet 1, a gradient coil 2, a gradient magnetic field power source 3, a bed 4, a bed control unit 5, a transmitting radio frequency (RF) coil 6, a transmitting unit 7, receiving RF coils 8a and 8b, a receiving unit 9, a sequence control unit 10, and a computing system 20.

The static magnetic field magnet 1 is shaped into a hollow cylinder to uniformly generate a static magnetic field in the interior space. A permanent magnet or a superconductive magnet may be adopted for the static magnetic field magnet 1.

The gradient coil 2 is shaped into a hollow cylinder, and provided inside the static magnetic field magnet 1. The gradient coil 2 is formed by coupling three coils in correspondence with the X, Y, and Z axes that are orthogonal to one another. These three coils separately receive currents from the gradient magnetic field power source 3 and thereby generate gradient magnetic fields in which the magnetic intensities differ from one another along the X, Y, and Z axes.

The gradient magnetic fields generated along the X, Y, and Z axes by the gradient coil 2 correspond to, for example, a readout gradient magnetic field Gr, a phase-encoding gradient magnetic field Ge, and a slice-selecting gradient magnetic field Gs. The readout gradient magnetic field Gr is used to change the frequency of an NMR signal in accordance with the spatial position. The phase-encoding gradient magnetic field Ge is used to change the phase of the NMR signal in accordance with the spatial position. The slice-selecting gradient magnetic field Gs is used to determine an imaging cross section.

The gradient magnetic field power source 3 supplies a current to the gradient coil 2. The bed 4 includes a top table 4a on which a subject P lies, and the top table 4a with the subject P thereon is inserted into the hollow (opening) of the gradient coil 2 under the control of the bed control unit 5. The bed 4 is generally arranged in such a manner that its longitudinal direction is parallel to the central axis of the static magnetic field magnet 1. The bed control unit 5 drives the bed 4 to move the top table 4a in the longitudinal direction and the vertical direction, under the control of a control unit 26.

The transmitting RF coil 6 is arranged inside the gradient coil 2 to receive a high-frequency pulse from the transmitting unit 7 and generate a high-frequency magnetic field. The transmitting unit 7 transmits a high-frequency pulse corresponding to the Larmor frequency to the transmitting RF coil 6.

The receiving RF coils 8a and 8b are arranged inside the gradient coil 2, and receive an NMR signal that is given off by the subject P under the influence of the high-frequency magnetic field generated by the transmitting RF coil 6. The receiving RF coils 8a and 8b are array coils that are formed by coupling several coil elements. Furthermore, the receiving RF coil 8a is a body coil that is placed on the abdominal side of the subject, while the receiving RF coil 8b is a spine coil that is placed on the spinal side of the subject. The two coils can be used at the same time.

Figure 2B:
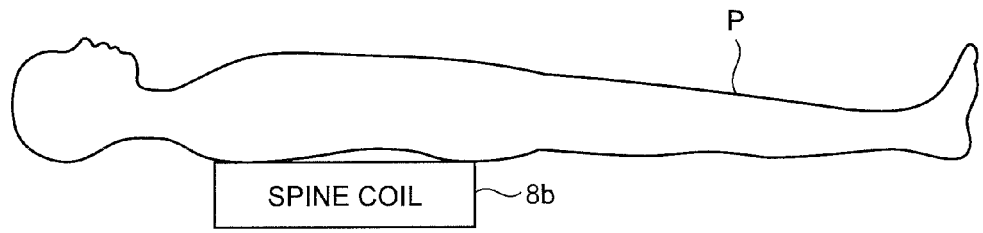

FIGS. 2A and 2B are diagrams for explaining the positional relationship of the receiving RF coils 8a and 8b illustrated in FIG. 1. In FIG. 2A, the positional relationship of the receiving RF coils 8a and 8b when taking an abdominal image is described. In FIG. 2B, the positional relationship of the receiving RF coil 8b is described when taking a spinal image.

As illustrated in FIG. 2A, when taking an abdominal image, the receiving RF coil 8a is placed on the abdominal side (top side) of the subject P who is lying on his/her back, and the receiving RF coil 8b is placed on the back side (bottom side). In addition, as illustrated in FIG. 2B, when taking a spinal image, the receiving RF coil 8b is placed on the back side of the subject P who is lying on his/her back. In this manner, the receiving RF coil 8b is placed on the back of the subject P and used for taking an abdominal image and also a spinal image.

In FIG. 1, the receiving unit 9 generates raw data of a digital signal in accordance with the NMR signal output by the receiving RF coils 8a and 8b, and transmits the generated raw data to the sequence control unit 10. The receiving unit 9 includes several receiving paths to transmit the NMR signal and the raw data. By suitably switching the receiving paths, combinations of the coil elements of the receiving RF coils 8a and 8b can be switched around in accordance with the use.

The sequence control unit 10 drives the gradient magnetic field power source 3, the transmitting unit 7, and the receiving unit 9, based on sequence execution data transmitted from the computing system 20 to scan the subject P. When the receiving unit 9 transmits raw data as the scanning result, the sequence control unit 10 transmits the k-space data to the computing system 20.

The sequence execution data represents data that is used for executing an image taking operation based on a certain sequence. In other words, the sequence execution data defines the intensity of the power supplied by the gradient magnetic field power source 3 to the gradient coil 2, the timing of supplying the power, the intensity of the RF signal transmitted by the transmitting unit 7 to the transmitting RF coil 6, the timing of transmitting the RF signal, the timing of the NMR signal detected by the receiving unit 9, and the like.

The computing system 20 controls the entire MRI apparatus 100, collects data, and reconstructs an image. Particularly, the computing system 20 includes an interface unit 21, an image reconstructing unit 22, a storage unit 23, an input unit 24, a display unit 25, and the control unit 26.

The interface unit 21 controls input/output of various signals that are exchanged with the sequence control unit 10. For example, the interface unit 21 transmits the sequence execution data to the sequence control unit 10 and receives the raw data from the sequence control unit 10.

The raw data received by the interface unit 21 is stored in the storage unit 23 as k-space data in which information of spatial frequencies in the slice encode (SE) direction, the phase encode (PE) direction, and the read-out (RO) direction in the slice-selecting gradient magnetic field Gs, the phase-encoding gradient magnetic field Ge, and the readout gradient magnetic field Gr generated by the gradient coil 2 is associated with one another.

The image reconstructing unit 22 performs a reconstructing process such as Fourier transform onto the k-space data stored in the storage unit 23 to create spectrum data or image data for a desired nuclear spin in the subject P.

The storage unit 23 stores therein the raw data (k-space data) received by the interface unit 21 and the image data generated by the image reconstructing unit 22 for each subject P.

The input unit 24 receives various instructions and information input by the operator. A pointing device such as a mouse and a trackball, a selection device such as a mode switch, and an input device such as a keyboard may be suitably adopted for the input unit 24.

The display unit 25 displays various types of information such as spectrum data and image data under the control of the control unit 26. A display device such as a liquid crystal display may be adopted for the display unit 25.

The control unit 26 controls the entire MRI apparatus 100. More specifically, the control unit 26 includes a not-shown central processing unit (CPU) and memories, and controls the operations of the above units by implementing various programs in response to an operator's instruction. In particular, the control unit 26 includes an imaging condition setting unit 26a and a path switching control unit 26b.

The imaging condition setting unit 26a sets up imaging conditions based on the information input by the operator through the input unit 24. The set-up imaging conditions include an imaging section that is a target section of the imaging. The path switching control unit 26b switches the receiving paths of the receiving unit 9 based on the imaging conditions set by the imaging condition setting unit 26a.

The entire structure of the MRI apparatus 100 according to the first embodiment has been described. In such a structure, the receiving RF coil 8b according to the first embodiment that can be used for taking an abdominal image and also a spinal image is configured with a coil element group that includes at least a figure-eight coil (also referred to as a saddle coil), a first loop coil arranged at the center of the figure-eight coil, and a second loop coil partially overlaid on the first loop coil.

Then, the path switching control unit 26b of the control unit 26 switches the receiving paths of the receiving unit 9 so that a signal can be received with a combination of the first loop coil and the second loop coil or a combination of the figure-eight coil and the first loop coil. In this manner, the coil elements can be easily decoupled according to the first embodiment, even in an apparatus that is provided with a function of changing combinations of coil elements of the RF coil in accordance with use.

The functions of the receiving RF coil 8b, the receiving unit 9, and the path switching control unit 26b are described in detail below.

Figure 3:
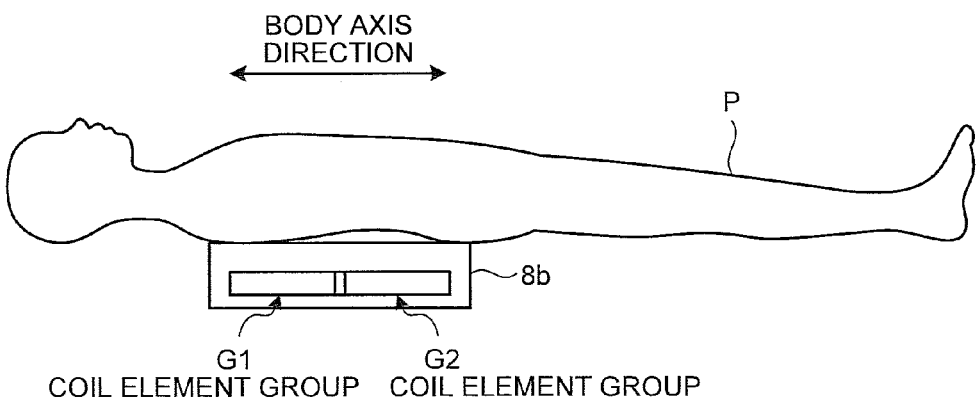
FIG. 3 is a diagram for explaining the structure of the receiving RF coil illustrated in FIG. 1.

First, the structure of the receiving RF coil 8b is explained. FIG. 3 is a diagram for explaining the structure of the receiving RF coil 8b illustrated in FIG. 1. In particular, the receiving RF coil 8b includes coil element groups G1 and G2.

The coil element groups G1 and G2 are aligned in such a manner as to form two lines in the direction of the body axis of the subject P. According to the first embodiment, the receiving RF coil 8b having two coil element groups in lines is described, but the number of coil element groups is not limited thereto.

Figure 4:
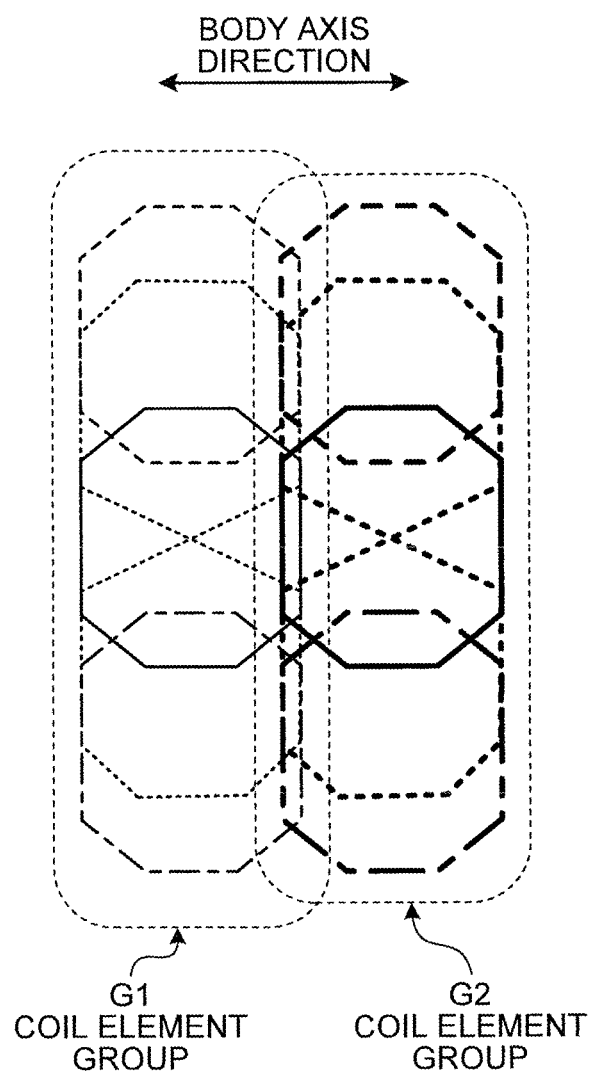
FIG. 4 is a diagram for explaining the arrangement of the coil element groups illustrated in FIG. 3.

Next, the arrangement of the coil element groups G1 and G2 illustrated in FIG. 3 is explained. FIG. 4 is a diagram for explaining the arrangement of the coil element groups G1 and G2 illustrated in FIG. 3. The loop coils and the figure-eight coil included in each of the coil element groups are aligned in the lateral direction of the subject P.

Figure 5:
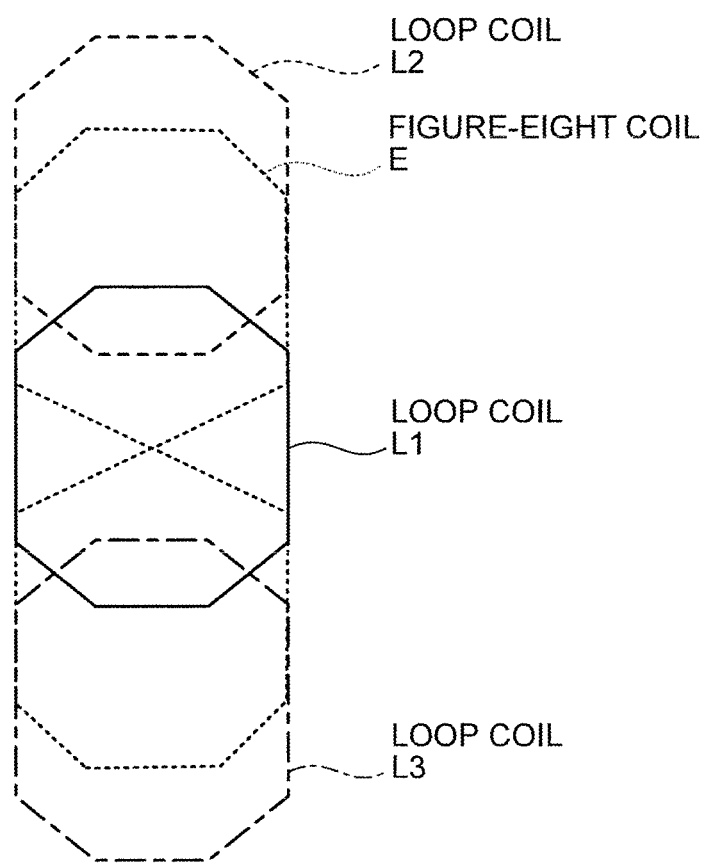
FIG. 5 is a diagram for explaining the structure of the coil element group illustrated in FIG. 4.

Next, the structure of the coil element groups G1 and G2 illustrated in FIG. 4 is explained. The coil element groups G1 and G2 illustrated in FIG. 4 have the same structure, and therefore the structure of the coil element group G1 is described as an example here. FIG. 5 is a diagram for explaining the structure of the coil element group G1 illustrated in FIG. 4. The coil element group G1 includes a figure-eight coil E and loop coils L1, L2 and L3.

The loop coil L1 is arranged at the center of the figure-eight coil E. The arrangement of the loop coil L1 at the center of the figure-eight coil E realizes decoupling of the figure-eight coil E and the loop coil L1.

Each of the loop coils L2 and L3 is partially overlaid on the loop coil L1. The arrangement of the loop coils L2 and L3 partially overlaid on the loop coil L1 realizes decoupling of the loop coils L1 and L2 and decoupling of the loop coils L1 and L3.

According to the first embodiment, the coil element groups G1 and G2 each having three loop coils and one figure-eight coil have been described, but the numbers of loop coils and figure-eight coils are not limited thereto. For example, two figure-eight coils or more may be incorporated, and four loop coils or more may be incorporated. In other words, any number of coils can be adopted as long as coils are arranged in such a manner that, when choosing and combining coils, at least two combinations that realize decoupling of coils are included.

Figure 6:
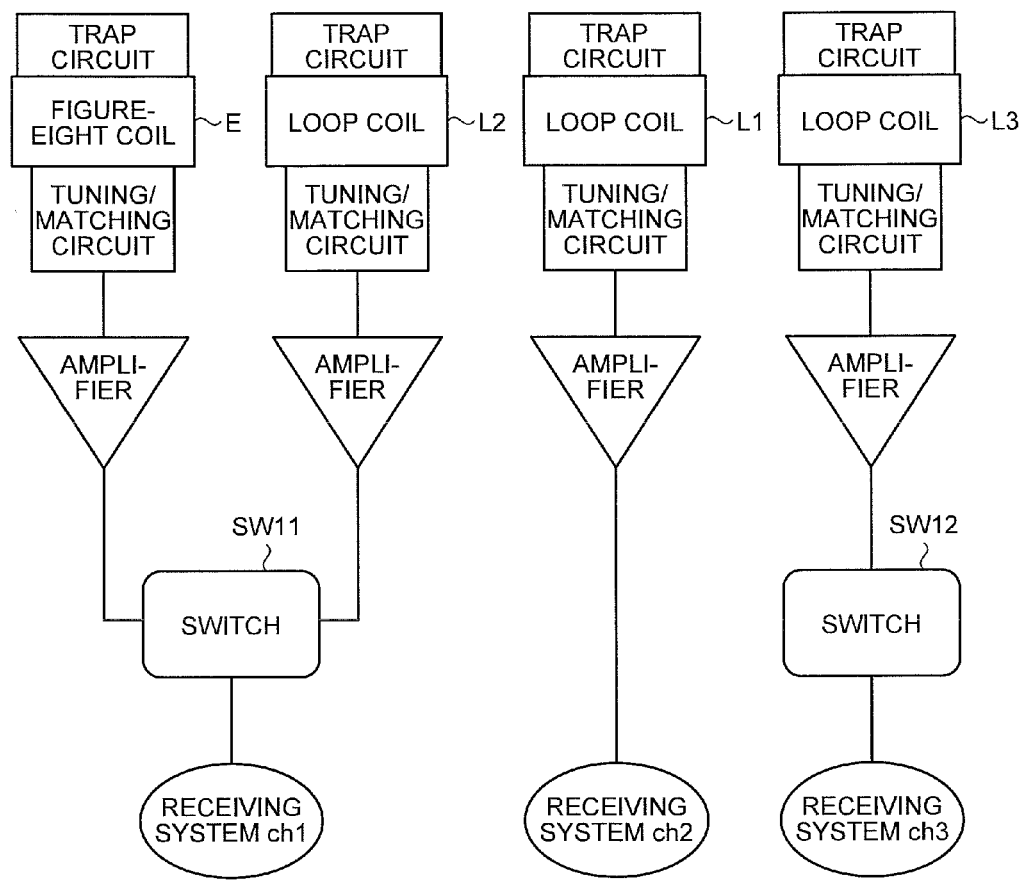
FIG. 6 is a diagram for explaining the coil elements of the coil element group and the receiving paths of the receiving units according to the first embodiment.

Next, the coil elements of the coil element group G1 and the receiving paths of the receiving unit 9 according to the first embodiment are explained. FIG. 6 is a diagram for explaining the coil elements of the coil element group G1 and the receiving paths of the receiving unit 9 according to the first embodiment. In FIG. 6, among the receiving paths of the receiving unit 9, three receiving paths (receiving systems ch1, ch2, and ch3) that are connected to the coil element group G1 are indicated.

Each of the coil elements, i.e., the figure-eight coil E and the loop coils L1, L2 and L3, is provided with a tuning/matching circuit and a trap circuit. The tuning/matching circuit adjusts the resonance frequency and the impedance of the coil element in such a manner as to facilitate the reception of the NMR signal.

The trap circuit includes a circuit element such as a P-intrinsic-N (PIN) diode and a capacitor, and increases the impedance of the coil element at the drive time. The passage of a current to the coil element can be blocked by driving this trap circuit.

In addition, an amplifier is connected to the output side of each tuning/matching circuit to amplify the NMR signal received by the coil element. Furthermore, switches SW11 and SW12 are arranged on the output side of the amplifiers to switch the receiving paths of the NMR signal. The amplifiers and the switches SW11 and SW12 may be implemented in the receiving RF coil 8b or the receiving unit 9.

More specifically, the output side of the amplifier that receives a signal from the figure-eight coil E and the output side of the amplifier that receives a signal from the loop coil L2 are both connected to the receiving system ch1 by way of the switch SW11. Further, the output side of the amplifier that receives a signal from the loop coil L1 is connected directly to the receiving system ch2. Finally, the output side of the amplifier that receives a signal from the loop coil L3 is connected to the receiving system ch3 by way of the switch SW12.

The switch SW11 can perform switching in such a manner that a conduction state is established between the receiving system ch1 and either one of the figure-eight coil E and the loop coil L2. The switch SW12 also switches between conductive and nonconductive states for the loop coil L3 and the receiving system ch3. In other words, by suitably controlling the switches SW11 and SW12, combinations of the coil elements of the receiving RF coils 8a and 8b can be switched around in accordance with usage.

Figure 7:
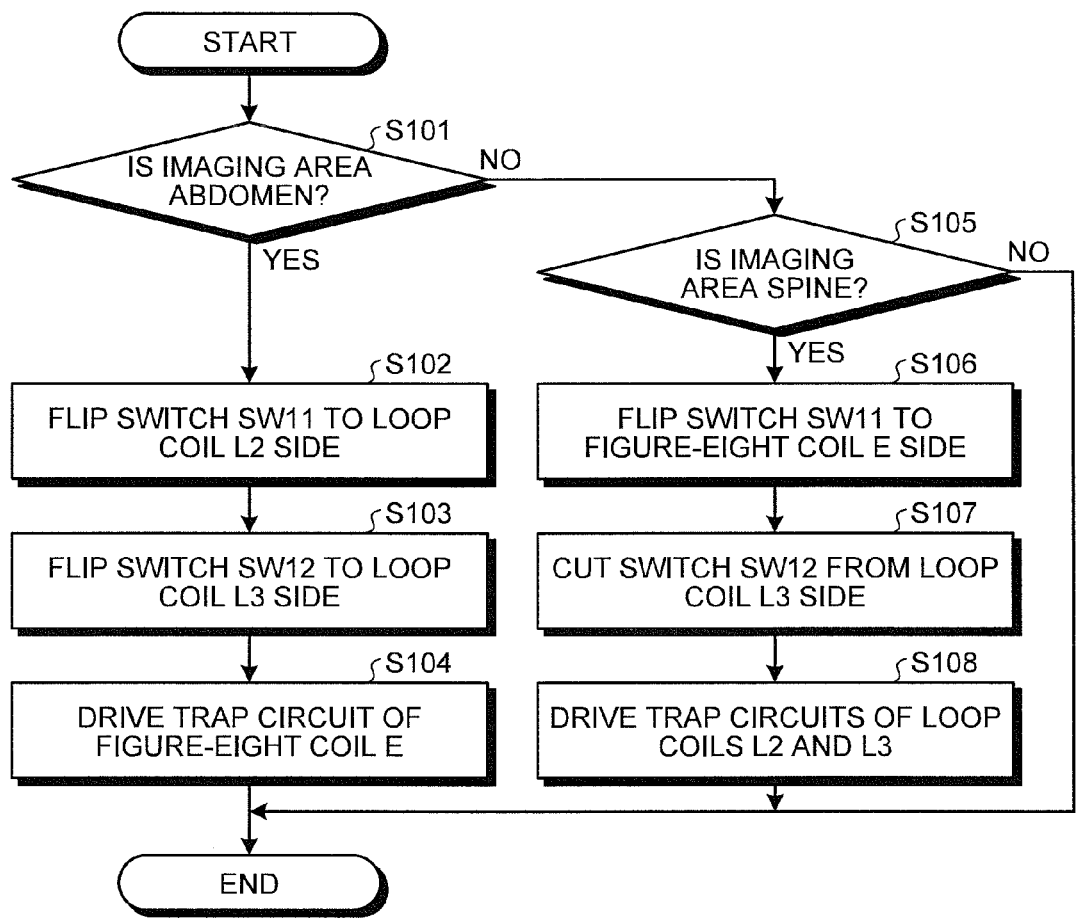
FIG. 7 is a flowchart of the receiving path switching procedure followed by a path switching control unit according to the first embodiment.

The receiving path switching procedure followed by the path switching control unit 26b according to the first embodiment is explained next. FIG. 7 is a flowchart of the receiving path switching procedure followed by the path switching control unit 26b according to the first embodiment. Moreover, FIG. 8 is a diagram for showing the receiving paths for abdominal imaging according to the first embodiment, and FIG. 9 is a diagram for showing the receiving paths for spinal imaging according to the first embodiment.

As illustrated in FIG. 7, at the time of receiving an NMR signal, the path switching control unit 26b first determines whether both of the receiving RF coils 8a and 8b are selected as RF coils that are used for image taking, based on the imaging conditions set by the imaging condition setting unit 26a.

Then, when both are selected, the path switching control unit 26b judges that an abdominal image is to be taken (yes at step S101) and flips the switch SW11 to the loop coil L2 side (step S102). Furthermore, the path switching control unit 26b flips the switch SW12 to the loop coil L3 side (step S103). The path switching control unit 26b also drives the trap circuit of the figure-eight coil E (step S104).

Figure 8:
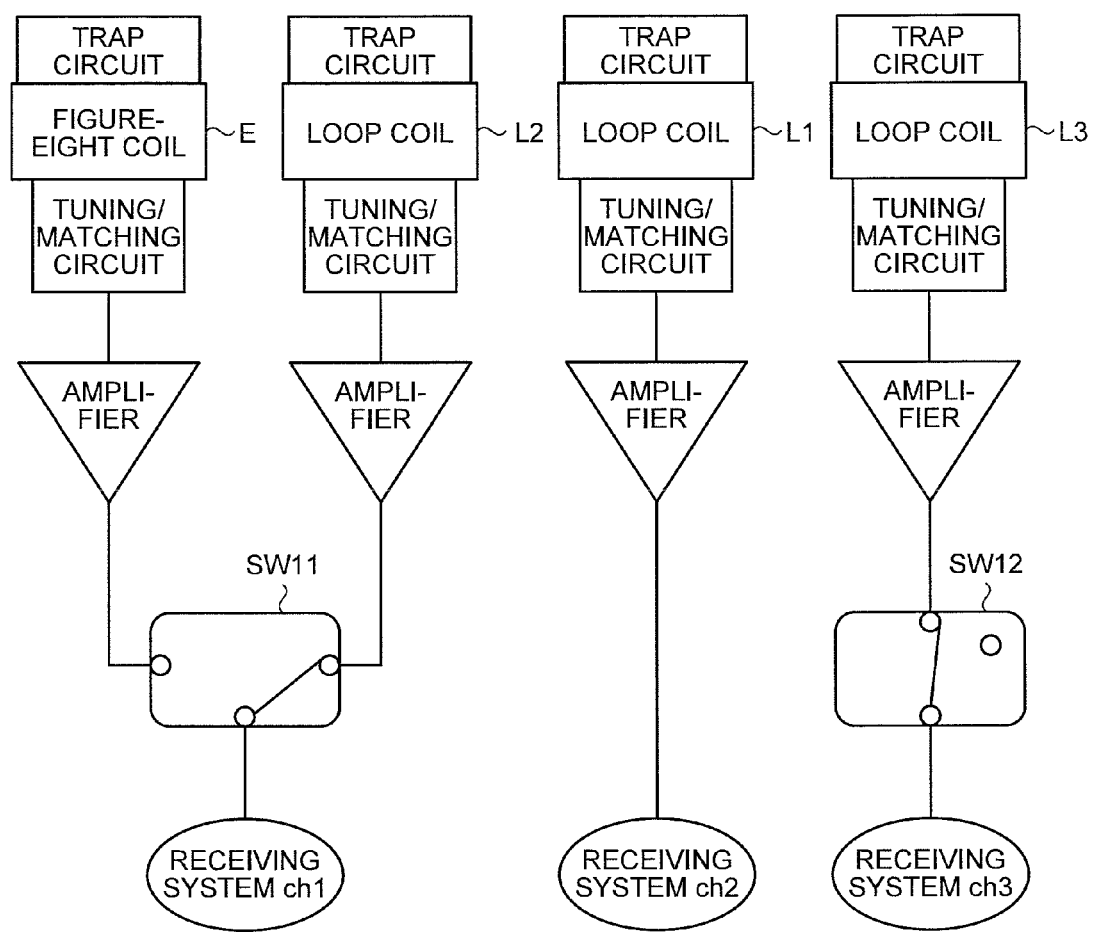
FIG. 8 is a diagram for showing the receiving paths for abdominal imaging according to the first embodiment.
Figure 9:
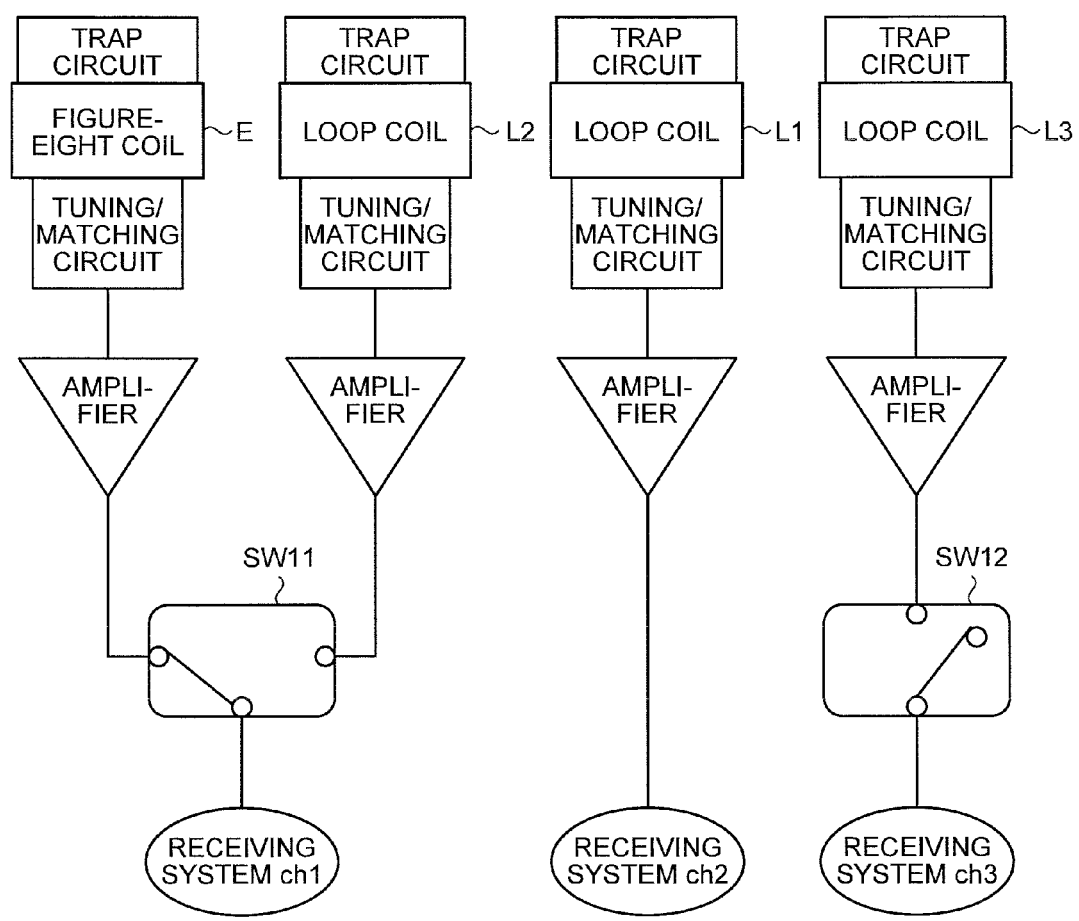
FIG. 9 is a diagram for showing the receiving paths for spinal imaging according to the first embodiment.

In this manner, as illustrated in FIG. 8, a conductive state is established between the loop coil L2 and the receiving system ch1 by way of the switch SW11; a conductive state is established between the loop coil L1 and the receiving system ch2; and a conductive state is established between the loop coil L3 and the receiving system ch3 by way of the switch SW12. Furthermore, the trap circuit of the figure-eight coil E obstructs the flow of current into the figure-eight coil E. As a result, an NMR signal is received with the combination of the loop coils L1, L2, and L3.

On the other hand, when only the receiving RF coil 8b is selected, the path switching control unit 26b judges that a spinal image is to be taken (yes at step S105), and flips the switch SW11 to the figure-eight coil E side (step S106). Furthermore, the path switching control unit 26b cuts the switch SW12 from the loop coil L3 side (step S107). The path switching control unit 26b also drives the trap circuits of the loop coils L2 and L3 (step S108).

In this manner, as illustrated in FIG. 9, a conductive state is established between the figure-eight coil E and the receiving system ch1 by way of the SW11, and also between the loop coil L1 and the receiving system ch2. Furthermore, the trap circuits of the loop coils L2 and L3 obstruct the flow of current into the loop coils L2 and L3. As a result, an NMR signal is received with the combination of the figure-eight coil E and the loop coil L1.

The path switching control unit 26b performs drive control on the switches and the trap circuits by sending control signals to the switches and the trap circuits through the control lines. If any of the switches and trap circuits are to be driven at the same timing, the control line can be shared. More specifically, as indicated in steps S102 to S104 of FIG. 7, because switching of the switch SW11 to the loop coil L2 side, switching of the switch SW12 to the loop coil L3 side, and driving of the trap circuit of the figure-eight coil E are conducted at the same timing, the control line for controlling these components can be shared.

Similarly, as indicated in steps S106 to S108, switching of the switch SW11 to the figure-eight coil E side, cutting of the switch SW12 from the loop coil L3 side, and driving of the trap circuits of the loop coils L2 and L3 are performed at the same timing, the control line for these components can also be shared. Moreover, when the transmitting RF coil 6 generates a high-frequency magnetic field, the current flow to all the coil elements of the receiving RF coil 8b should be obstructed, and thus all the trap circuits need to be driven at a time. In other words, at least three control lines are required to control one coil element group.

As described above, according to the first embodiment, the receiving RF coil 8b that is used for taking an abdominal image and a spinal image includes a coil element group of the figure-eight coil E, the loop coil L1 arranged at the center of the figure-eight coil E, and the loop coils L2 and L3 partially overlaid on the loop coil L1. Then, the path switching control unit 26b of the control unit 26 switches the receiving paths of the receiving unit 9 so that a signal is received with the combination of the loop coils L1, L2, and L3 or the combination of the figure-eight coil E and the loop coil L1. Hence, even in an apparatus provided with a function of switching a combination of coil elements of the RF coil in accordance with the usage, the coil elements can be easily decoupled.

Some of the conventional MRI apparatus include a synthesis circuit that changes phases of signals received by the coil elements and combines them. The present invention is equally applicable to MRI apparatus of such a type. According to the second embodiment, the application of the present invention to an MRI apparatus including a synthesis circuit in its receiving unit is described.

Basically, the MRI apparatus according to the second embodiment has a structure similar to the MRI apparatus 100 according to the first embodiment, with only a difference in the structure of the receiving paths of the receiving unit 9. Thus, the explanation of the second embodiment focuses on the coil elements of the coil element group G1, the receiving paths of the receiving unit 9, and the receiving path switching procedure followed by the path switching control unit 26b according to the first embodiment.

Figure 10:
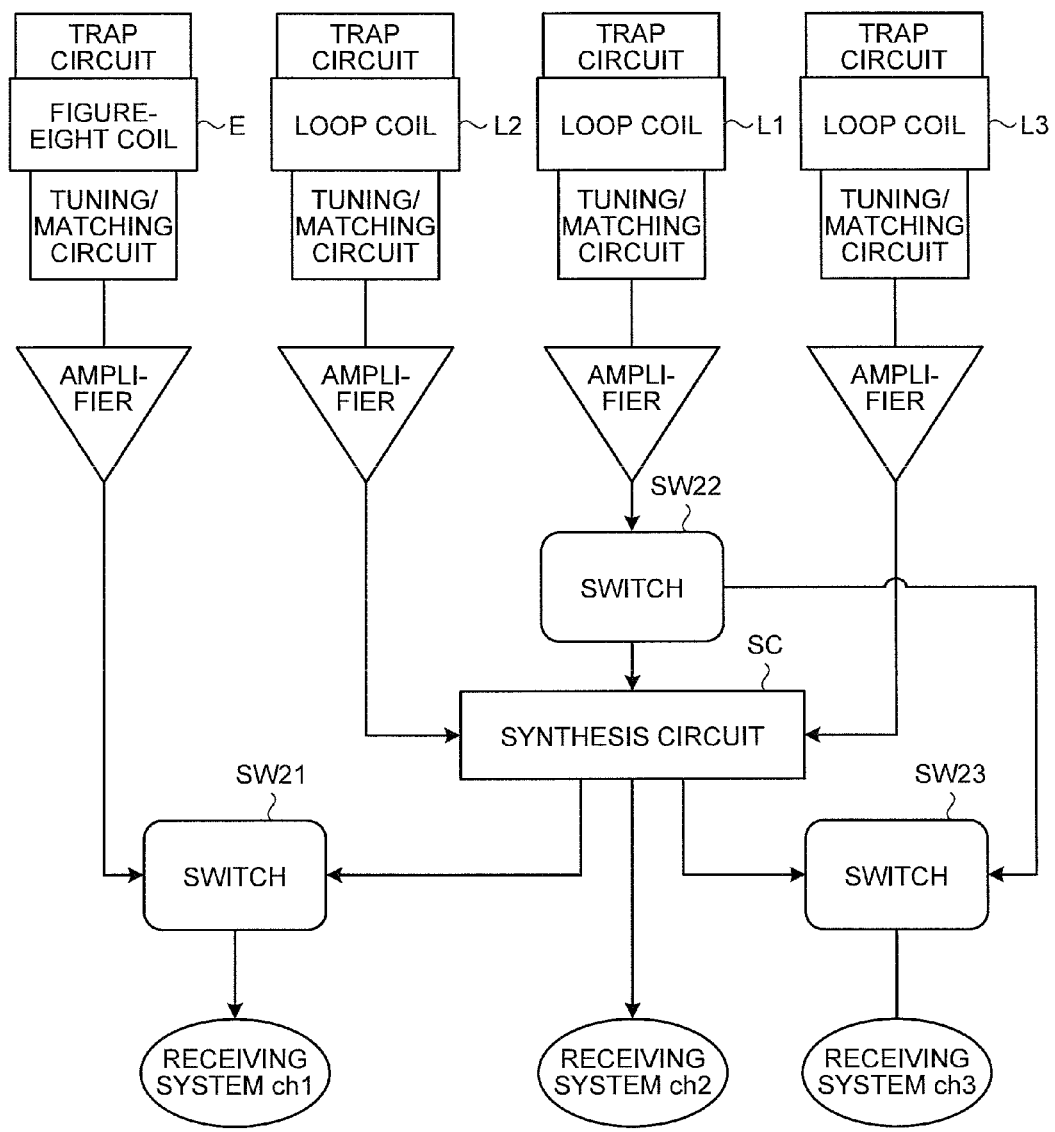
FIG. 10 is a diagram for explaining coil elements of a coil element group and receiving paths of receiving units according to the second embodiment.

First, the coil elements of the coil element group G1 and the receiving paths of the receiving unit 9 according to the second embodiment are explained. FIG. 10 is a diagram for explaining the coil elements of the coil element group G1 and the receiving paths of the receiving unit 9 according to the second embodiment. In FIG. 10, among the receiving paths of the receiving unit 9, three receiving paths (receiving systems ch1, ch2, and ch3) that are connected to the coil element group G1 are illustrated.

A tuning/matching circuit and a trap circuit are arranged in each of the coil elements, i.e., the figure-eight coil E and the loop coils L1, L2, and L3. The tuning/matching circuit adjusts the resonance frequency and the impedance of the coil element in such a manner to facilitate the reception of an NMR signal.

The trap circuit includes a circuit element such as a P-intrinsic-N (PIN) diode and a capacitor, and increases the impedance of the coil element at the time of driving. By driving this trap circuit, the flow of current to the coil element can be blocked.

Furthermore, an amplifier is connected to the output side of each tuning/matching circuit to amplify the NMR signal received by the coil element. Switches SW21, SW22, and SW23 and a synthesis circuit SC are arranged on the output side of the amplifiers to switch the receiving paths of the NMR signal. The amplifiers, the switches SW21, SW22, and SW23, and the synthesis circuit SC may be provided in the receiving RF coil 8*b* or the receiving unit 9.

More specifically, the output side of the amplifier that receives a signal from the figure-eight coil E is connected to the receiving system ch1 by way of the switch SW21. Furthermore, the output side of the amplifier that receives a signal from the loop coil L1 is connected to the synthesis circuit SC and the switch SW23 by way of the switch SW22. The output side of the amplifier that receives a signal from the loop coil L2 and the output side of the amplifier that receives a signal from the loop coil L3 are both connected directly to the synthesis circuit SC. Moreover, the output side of the synthesis circuit SC is branched into three paths, with the first path connected to the receiving system ch1 by way of the switch SW21, the second path connected directly to the receiving system ch2, and the third path connected to the receiving system ch3 by way of the switch SW23.

The switch SW21 performs switching in such a manner that a conductive state is established between the receiving system ch1 and either one of the figure-eight coil E and the synthesis circuit SC. In addition, the switch SW22 performs switching in such a manner that a conductive state is established between the loop coil L1 and either one of the synthesis circuit SC and the switch SW23. The switch SW23 performs switching in such a manner that a conductive state is established between the receiving system ch3 and either one of the synthesis circuit SC and the switch SW22. In other words, by suitably controlling these switches SW21, SW22, and SW23, combinations of coil elements of the receiving RF coils 8*a* and 8*b* can be switched in accordance with the usage.

Figure 11:
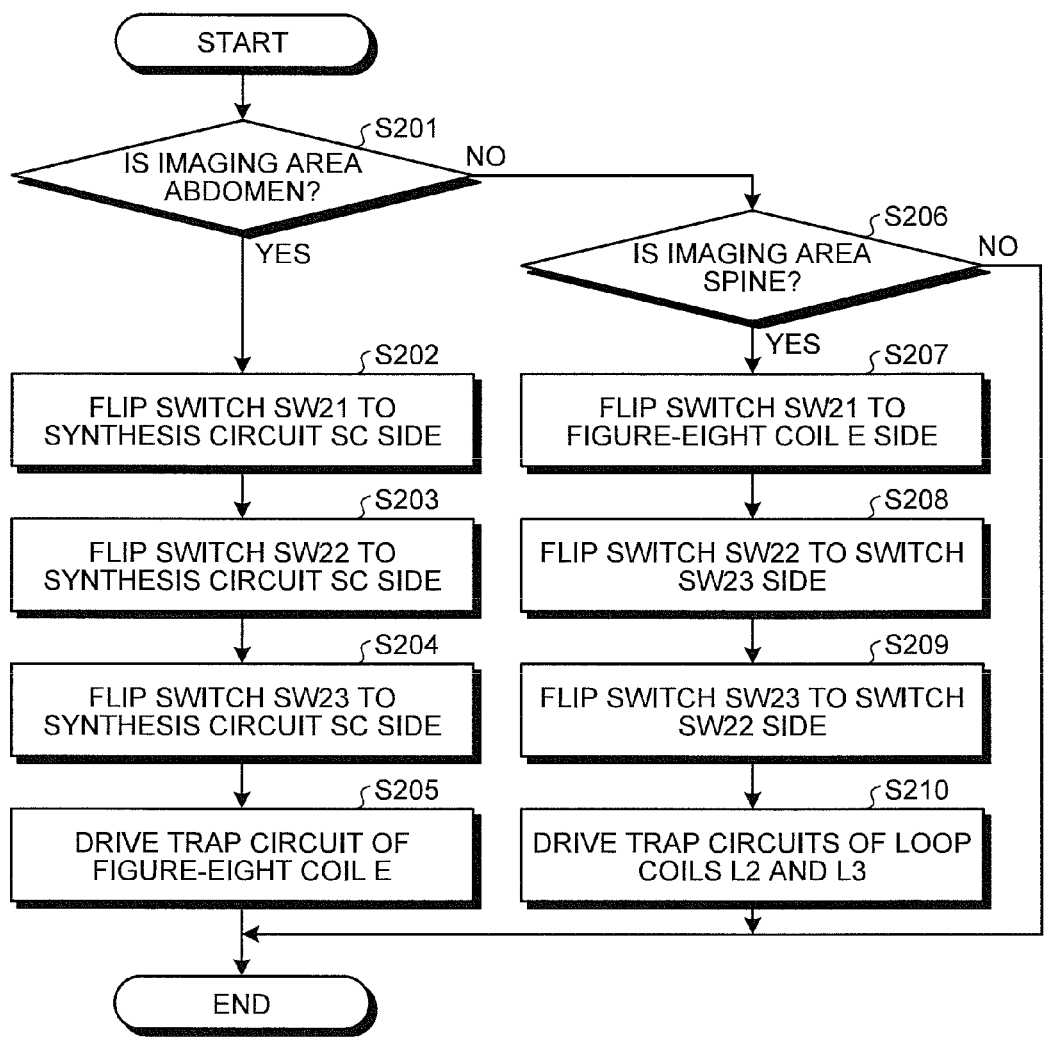
FIG. 11 is a flowchart of the receiving path switching procedure followed by a path switching control unit according to the second embodiment.
Figure 12:
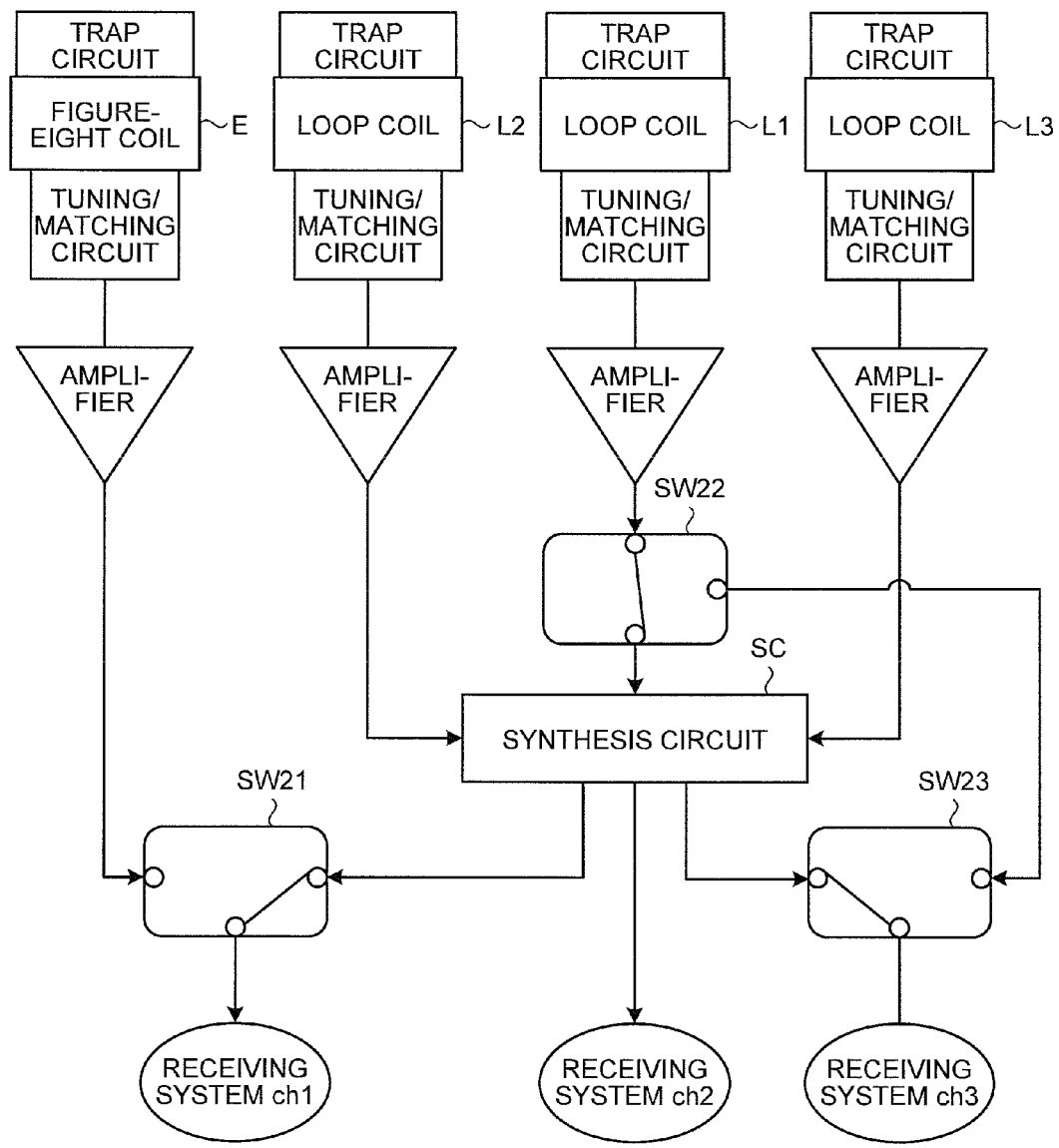
FIG. 12 is a diagram for showing the receiving paths for abdominal imaging according to the second embodiment.
Figure 13:
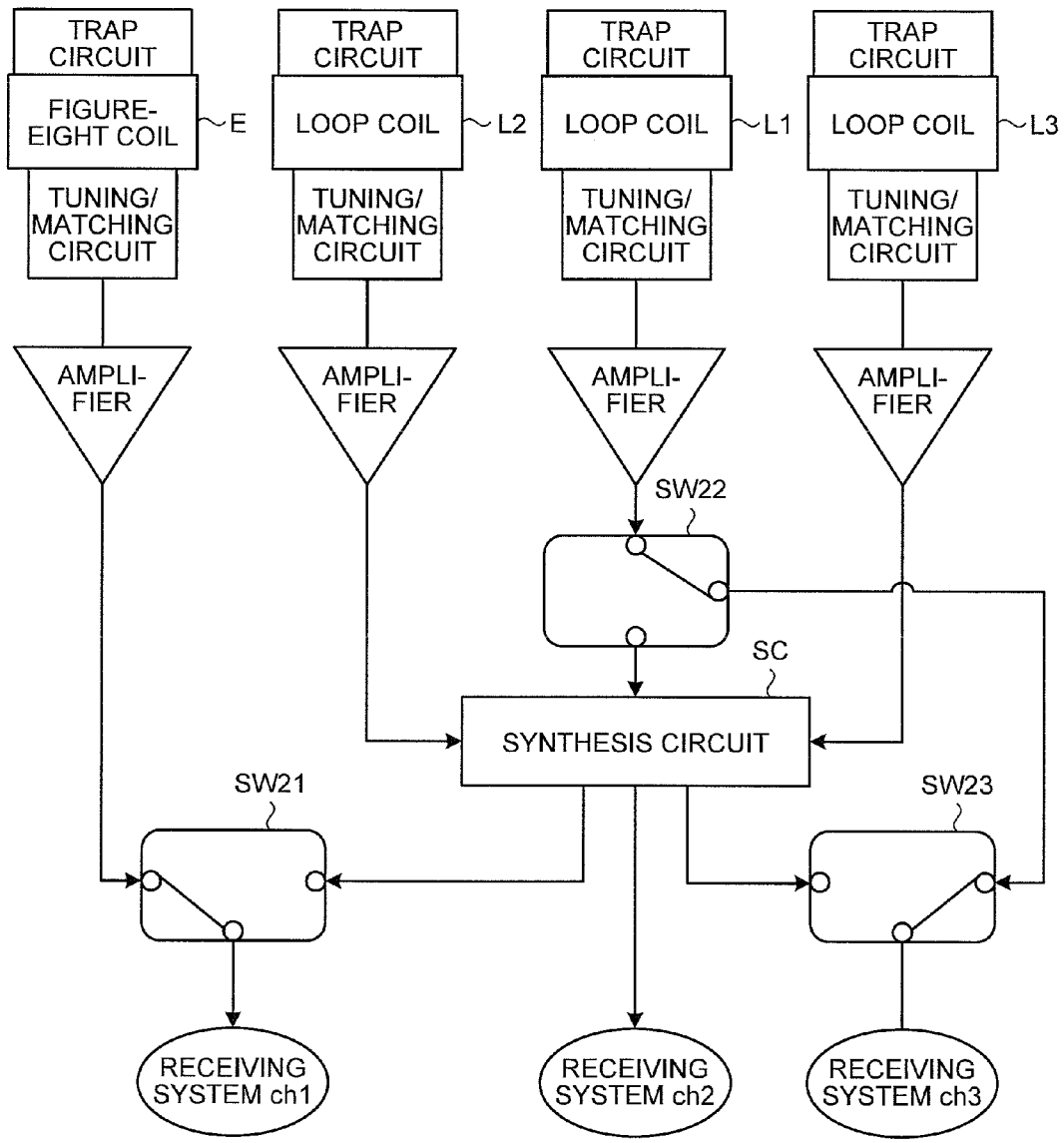
FIG. 13 is a diagram for showing the receiving paths for spinal imaging according to the second embodiment.
Figure 14A:
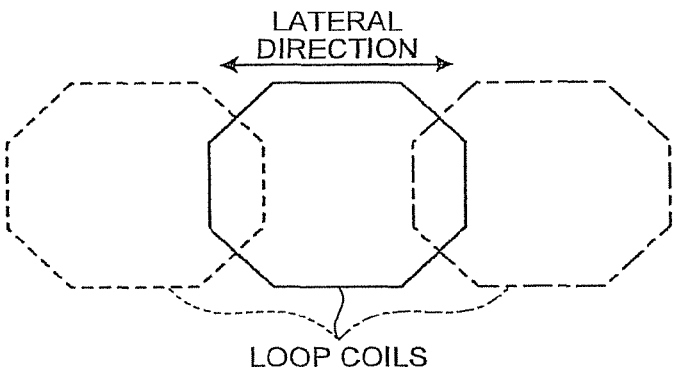
FIGS. 14A to 14D are diagrams for explaining geometrical arrangements of coil element groups in conventional array coils.
Figure 14B:
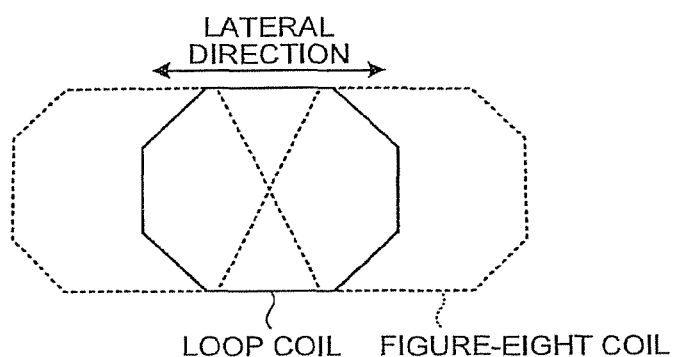
Figure 14C:
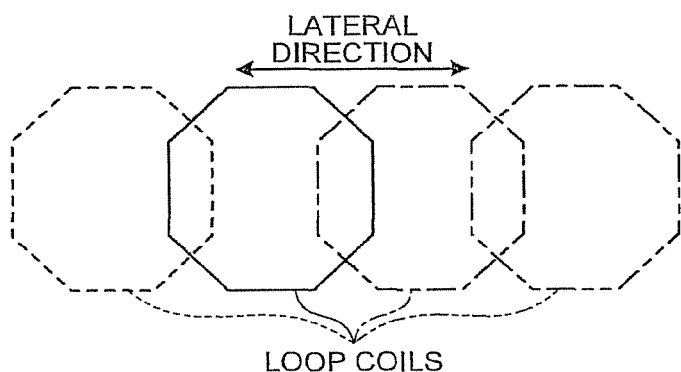
Figure 14D:
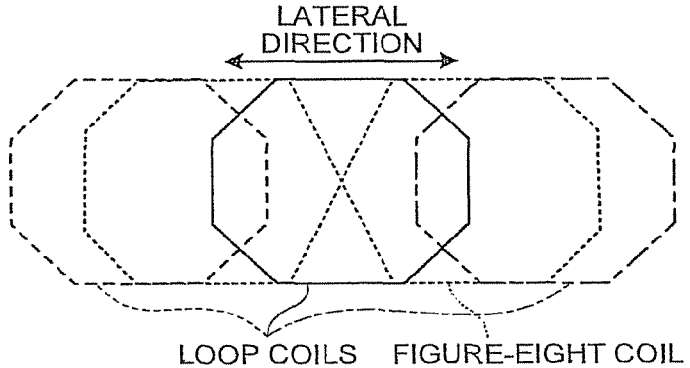

Next, the receiving path switching procedure followed by the path switching control unit 26*b* according to the second embodiment is explained. FIG. 11 is a flowchart of the receiving path switching procedure followed by the path switching control unit 26*b* according to the second embodiment. FIG. 12 is a diagram for showing the receiving paths according to the second embodiment for abdominal imaging, and FIG. 13 is a diagram for showing the receiving paths according to the second embodiment for spinal imaging.

As indicated in FIG. 11, at the time of receiving an NMR signal, the path switching control unit 26*b* first determines whether both of the receiving RF coils 8*a* and 8*b* are selected as RF coils that are used for image taking, based on the imaging conditions set by the imaging condition setting unit 26*a*.

When both are selected, the path switching control unit 26*b* judges that an abdominal image is to be taken (yes at step S201), and flips the switch SW21 to the synthesis circuit SC side (step S202). The path switching control unit 26*b* also flips the switch SW22 to the synthesis circuit SC side (step S203). In addition, the path switching control unit 26*b* flips the switch SW23 to the synthesis circuit SC side (step S204). Furthermore, the path switching control unit 26*b* drives the trap circuit of the figure-eight coil E (step S205).

In this manner, as illustrated in FIG. 12, a conductive state is established between the synthesis circuit SC and each of the loop coils L1, L2, and L3, and also between each of the receiving systems ch1, ch2, and ch3 and the synthesis circuit SC. Furthermore, the trap circuit of the figure-eight coil E obstructs the flow of current into the figure-eight coil E. As a result, an NMR signal is received with the combination of the loop coils L1, L2, and L3.

On the other hand, when only the receiving RF coil 8*b* is selected, the path switching control unit 26*b* judges that a spinal image is to be taken (yes at step S206), and flips the switch SW21 to the figure-eight coil E side (step S207). The path switching control unit 26*b* also flips the switch SW22 to the switch SW23 side (step S208). In addition, the path switching control unit 26*b* flips the switch SW23 to the switch SW22 side (step S209). Furthermore, the path switching control unit 26*b* drives the trap circuits of the loop coils L2 and L3 (step S210).

In this manner, as illustrated in FIG. 13, a conductive state is established between the figure-eight coil E and the receiving system ch1 by way of the switch SW21, and between the loop coil L1 and the receiving system ch1 by way of the switches SW22 and SW23. Furthermore, the trap circuits of the loop coils L2 and L3 obstruct the flow of current into the loop coils L2 and L3. Then, an NMR signal is received with the combination of the figure-eight coil E and the loop coil L1.

As described above, according to the second embodiment, in a similar manner to the first embodiment, the receiving RF coil 8*b* that is used for taking an abdominal image and a spinal image has a coil element group including the figure-eight coil E, the loop coil L1 arranged at the center of the figure-eight coil E, and the loop coils L2 and L3 partially overlaid on the loop coil L1. Then, the path switching control unit 26*b* of the control unit 26 switches the receiving paths of the receiving unit 9 so that a signal is received with the combination of the loop coils L1, L2, and L3 or the combination of the figure-eight coil E and the loop coil L1. Hence, even when an apparatus is provided with a synthesis circuit that combines the signals received by multiple coil elements, the coil elements can be easily decoupled.

According to the present embodiments, the MRI apparatus 100 includes the receiving RF coil 8*a* that can be used at the same time with the receiving RF coil 8*b*. For this reason, an image can be taken in a wide range of imaging area by use of the two receiving RF coils.

Furthermore, according to the present embodiments, the path switching control unit 26*b* determines whether the receiving RF coils 8*a* and 8*b* are used at the same time, based on the imaging conditions set by the operator, and switches the receiving paths, based on the determination results. Hence, the combinations of coil elements that are used for image taking can be automatically switched.

There are several examples of methods that can be adopted for determining whether the receiving RF coils 8*a* and 8*b* are used at the same time based on the imaging conditions. For example, receiving RF coils used for implementing a sequence may be predetermined in correspondence with different imaging sequences that are selected at the time of setting imaging conditions. When the receiving RF coils corresponding to the imaging sequences selected by the operator include both the abdominal imaging coil and the spinal imaging coil, the path switching control unit 26*b* judges that an abdominal image is to be taken. On the other hand, when the receiving RF coils corresponding to the selected imaging sequences include the spinal imaging coil but not the abdominal imaging coil, the path switching control unit 26*b* judges that a spinal image is to be taken.

Moreover, the MRI apparatus 100 may be provided with a function of allowing the operator to select a receiving RF coil that is used for image taking (e.g., a Graphical User Interfaces for selecting a receiving RF coil) as an imaging condition setting function. When the receiving RF coils selected by the operator include both the abdominal imaging coil and the spinal imaging coil, the path switching control unit 26*b* judges that an abdominal image is to be taken. On the other hand, when the receiving RF coils include the spinal imaging coil but not the abdominal imaging coil, the path switching control unit 26*b* judges that a spinal image is to be taken.

Moreover, according to the present embodiments, whether the receiving RF coils 8*a* and 8*b* are used at the same time is determined based on the imaging conditions, but the present invention is not limited thereto. For example, the path switching control unit 26*b* may be configured to acquire identification information for identifying the type of RF coil from the RF coil electrically connected to the apparatus and make a determination as to whether the receiving RF coils 8*a* and 8*b* are used at the same time, based on the acquired identification information.

For example, when the acquired identification information includes identification information of each of the abdominal imaging coil and the spinal imaging coil, the path switching control unit 26*b* judges that an abdominal image is to be taken. On the other hand, when the acquired identification information includes the identification information of the spinal imaging coil but not of the abdominal imaging coil, the path switching control unit 26*b* judges that a spinal image is to be taken.

In addition, when, for example, ports for connecting the receiving RF coils to the main body of the MRI apparatus 100 are provided in accordance with uses, the receiving paths may be switched based on which of the ports the receiving RF coil for imaging is connected to. For example, an abdominal imaging port and a spinal imaging port are provided as ports for connecting the receiving RF coil 8*b* placed on the back of the subject P. Then, the path switching control unit 26*b* monitors the connections of the ports, and judges that an abdominal image is to be taken when the receiving RF coil 8*b* is connected to the abdominal imaging port. On the other hand, when the receiving RF coil 8*b* is connected to the spinal imaging port, the path switching control unit 26*b* judges that a spinal image is to be taken.

According to the above embodiments, the receiving RF coil 8*b* includes several coil element groups, and the coil element groups are aligned in the direction of the body axis of the subject, with the loop coil and the figure-eight coil of each coil element group aligned in the lateral direction of the subject. In this manner, even with an RF coil configured to cover a wide range of area in the body axis direction, the combinations of coil elements can be switched around, while the coil elements can be readily decoupled.

Furthermore, according to the above embodiments, the receiving RF coil 8*b* is placed on the back of the subject. Thus, the back-side receiving RF coil can be shared for abdominal imaging and spinal imaging, and an excellent image can be obtained in both imaging.

According to the above embodiments, amplifiers that amplify signals received by coil elements are incorporated, and the path switching control unit 26*b* switches the receiving paths by controlling the switches connected to the receiving paths. These switches are connected to the output side of the amplifiers. In other words, because a signal received by a coil element passes the switches after being amplified by an amplifier, influence of the switches on the signal can be minimized.

According to the above embodiments, the receiving RF coils 8*a* and 8*b* are separately placed on the subject, but the present invention is not limited thereto. For example, the present invention is equally applicable to a structure in which the receiving RF coil 8*b* is arranged with the receiving RF coil 8*a* in a detachable manner with respect to the receiving RF coil 8*a*. In other words, in an abdominal RF coil that can be separated into an abdominal section and a spinal section, the present invention may be applied to the coil element group thereof that is placed on the back side. Even when the RF coil is formed with a number of coil element groups such as an integral coil of a whole body imaging type, the present invention may be applied to the coil element group that is placed on the back side.

According to the above embodiments, the MRI apparatus 100 includes a receiving RF coil and a transmitting RF coil, but the present invention is not limited thereto. For example, the present invention is equally applicable to an RF coil that is used for both transmission and reception. In such a situation, the path switching control unit 26*b* switches paths of high-frequency pulses supplied from the transmitting unit 7 to the RF coil in the same manner as switching the receiving paths as explained in the above embodiments.

According to the above embodiments, abdominal and spinal images are taken, but the present invention is not limited thereto. For example, in an RF coil that is configured to be used for taking images of a wide range and of a narrow range, such as for taking images of the entire torso and of a specific organ, the present invention is equally applicable to the switching of combinations of coil elements. The present invention can obtain excellent images of both wide range and narrow range.

According to the above embodiments, the application of the present invention focuses on an RF coil formed by combining a figure-eight coil and three loop coils, but the present invention is not limited thereto. For example, the present invention can be applied to any RF coil including coil elements of at least two different types. The RF coil here represents, for example, a head RF coil, a parallel imaging RF coil that can cover from the chest to the abdomen, and an RF coil that can be used for general purpose regardless of imaging portions. In such a situation, the path switching control unit 26*b* switches signal transmitting paths based on the imaging conditions so that a signal is received and/or transmitted by either one or both of the two coil elements of the RF coil.

As described above, the magnetic resonance imaging apparatus and the RF coil according to the present invention are effective when an array coil formed by coupling several coil elements is incorporated, and especially when a spine coil placed on the back of the subject is incorporated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus, comprising:
an RF coil having a coil element group forming at least a first combination of a figure-eight coil and a first loop coil arranged at center of the figure-eight coil, and a second combination of the first loop coil, a second loop coil partially overlaid on one side of the first loop coil and a third loop coil partially overlaid on the other side of the first loop coil;
at least one first signal transmitting path for selectively transmitting a signal to and from the first combination;
at least one second signal transmitting path for selectively transmitting a signal to and from the second combination; and
at least one path switching unit connected to the first signal transmitting path and the second signal transmitting path for selectively switching between the first signal transmitting path and the second signal transmitting path so that the signal is received and/or transmitted with the first combination or the second combination, wherein
each loop of two loops of the figure-eight coil, the first loop coil, the second loop coil and the third loop coil are aligned along a direction.

2. The magnetic resonance imaging apparatus according to claim 1, wherein the RF coil includes one figure-eight coil, one first loop coil, and two second loop coils.

3. The magnetic resonance imaging apparatus according to claim 1, wherein:
the RF coil is a first RF coil; and
the magnetic resonance imaging apparatus further comprises a second RF coil that can be used simultaneously with the first RF coil.

4. The magnetic resonance imaging apparatus according to claim 2, wherein:
the RF coil is a first RF coil; and
the magnetic resonance imaging apparatus further comprises a second RF coil that can be used simultaneously with the first RF coil.

5. The magnetic resonance imaging apparatus according to claim 3, wherein the second RF coil is configured to be detachable with respect to the first RF coil.

6. The magnetic resonance imaging apparatus according to claim 4, wherein the second RF coil is configured to be detachable with respect to the first RF coil.

7. The magnetic resonance imaging apparatus according to claim 3, wherein the path switching unit determines whether the first RF coil and the second RF coil are simultaneously used, and switches the transmitting paths in accordance with a determination result.

8. The magnetic resonance imaging apparatus according to claim 4, wherein the path switching unit determines whether the first RF coil and the second RF coil are simultaneously used, and switches the transmitting paths in accordance with a determination result.

9. The magnetic resonance imaging apparatus according to claim 7, wherein the path switching unit judges, in accordance with imaging conditions set by an operator, whether the first RF coil and the second RF coil are simultaneously used.

10. The magnetic resonance imaging apparatus according to claim 1, wherein the RF coil includes a plurality of coil element groups that are aligned in a body axis direction of the subject, and loop coils and a figure-eight coil included in each of the coil element groups are aligned in a lateral direction of the subject.

11. The magnetic resonance imaging apparatus according to claim 2, wherein the RF coil includes a plurality of coil element groups that are aligned in a body axis direction of the subject, and loop coils and a figure-eight coil included in each of the coil element groups are aligned in a lateral direction of the subject.

12. The magnetic resonance imaging apparatus according to claim 3, wherein the first RF coil includes a plurality of coil element groups that are aligned in a body axis direction of the subject, and loop coils and a figure-eight coil included in each of the coil element groups are aligned in a lateral direction of the subject.

13. The magnetic resonance imaging apparatus according to claim 1, wherein the RF coil is placed on the back of the subject.

14. The magnetic resonance imaging apparatus according to claim 2, wherein the RF coil is placed on the back of the subject.

15. The magnetic resonance imaging apparatus according to claim 3, wherein the first RF coil is placed on the back of the subject.

16. The magnetic resonance imaging apparatus according to claim 1, further comprising an amplifier that amplifies a signal received by the coil element group, wherein:
the path switching unit switches the transmitting paths by controlling a switch connected to the transmitting paths; and
the switch is connected to an output side of the amplifier.

17. The magnetic resonance imaging apparatus according to claim 2, further comprising an amplifier that amplifies a signal received by the coil element group, wherein:
the path switching unit switches the transmitting paths by controlling a switch connected to the transmitting paths; and
the switch is connected to an output side of the amplifier.

18. The magnetic resonance imaging apparatus according to claim 3, further comprising an amplifier that amplifies a signal received by the coil element group, wherein:
the path switching unit switches the transmitting paths by controlling a switch connected to the transmitting paths; and
the switch is connected to an output side of the amplifier.

* * * * *